United States Patent
Rien et al.

(10) Patent No.: US 10,770,410 B2
(45) Date of Patent: Sep. 8, 2020

(54) CIRCUIT ALTERATION DETECTION IN INTEGRATED CIRCUITS

(71) Applicant: Arm Limited, Cambridge (GB)

(72) Inventors: Mikael Yves Marie Rien, Bernin (FR); Subbayya Chowdary Yanamadala, Dallas, TX (US)

(73) Assignee: ARM LIMITED, Cambridge (GB)

( * ) Notice: Subject to any disclaimer, the term of this patent is extended or adjusted under 35 U.S.C. 154(b) by 3 days.

(21) Appl. No.: 16/054,123

(22) Filed: Aug. 3, 2018

(65) Prior Publication Data

US 2020/0043870 A1   Feb. 6, 2020

(51) Int. Cl.
*H01L 25/00* (2006.01)
*H01L 23/00* (2006.01)

(52) U.S. Cl.
CPC .................. *H01L 23/576* (2013.01)

(58) Field of Classification Search
CPC ......... H01L 23/48; H01L 23/02; H01L 23/04; H01L 23/12
USPC .......................................................... 327/564
See application file for complete search history.

(56) References Cited

U.S. PATENT DOCUMENTS

| | | | | |
|---|---|---|---|---|
| 5,406,630 A * | 4/1995 | Piosenka | .................. | G01K 7/01 257/E23.08 |
| 6,853,093 B2 * | 2/2005 | Cohen | .................. | H01L 23/576 257/678 |
| 7,352,203 B1 * | 4/2008 | Ziomek | .............. | H03K 19/0008 326/8 |
| 7,723,998 B2 * | 5/2010 | Doi | ........................ | H01L 23/576 324/555 |
| 7,812,428 B2 * | 10/2010 | Peytavy | ................ | H01L 23/576 257/659 |
| 7,898,090 B1 * | 3/2011 | Eaton | ................. | H01L 23/49816 257/777 |
| 7,923,830 B2 * | 4/2011 | Pope | ................. | H01L 23/49816 174/261 |
| 8,552,566 B1 * | 10/2013 | Zeta | ...................... | H01L 23/576 257/686 |
| 9,419,614 B2 * | 8/2016 | Wang | ..................... | G06F 21/86 |
| 2006/0231633 A1 * | 10/2006 | Farooq | ............. | G06K 19/07381 235/492 |

(Continued)

OTHER PUBLICATIONS

Umut Guvenc and Bilgem Tubitak, "Active Shield with Electrically Configurable Interconnections", Securware 2013: The Seventh International Conference on Emerging Security Information, Systems and Technology, 2013, 43-45, Kocaeli, Turkey.

(Continued)

*Primary Examiner* — Ryan Jager
(74) *Attorney, Agent, or Firm* — Talem IP Law, LLP

(57) ABSTRACT

A system with circuit alteration detection can include a shield in at least one metal layer over an integrated circuit, and a detector coupled to the shield to detect a change in impedance characteristics of one or more shield lines of the shield due to physical alteration of the shield. The shield lines can be arranged in one or more metal layers and cover an area with shape arrangements such as parallel lines and serpentines. The detector can include one or more comparators to detect a difference in impedance of more than a tolerance value. An appropriate countermeasure response can be initiated upon detection of the difference in impedance.

25 Claims, 11 Drawing Sheets

(56) References Cited

U.S. PATENT DOCUMENTS

| | | | |
|---|---|---|---|
| 2007/0018334 A1* | 1/2007 | Peytavy | G06F 21/86 |
| | | | 257/778 |
| 2007/0038865 A1* | 2/2007 | Oggioni | G06F 21/87 |
| | | | 713/178 |
| 2008/0251906 A1* | 10/2008 | Eaton | H01L 23/576 |
| | | | 257/686 |
| 2013/0104252 A1 | 4/2013 | Yanamadala et al. | |
| 2018/0061196 A1 | 3/2018 | Busby et al. | |
| 2018/0061780 A1* | 3/2018 | Arora | G01R 31/026 |
| 2018/0107845 A1* | 4/2018 | Wesson | G06F 1/26 |
| 2019/0043794 A1* | 2/2019 | Kapusta | H01L 23/49827 |

OTHER PUBLICATIONS

International Search Report and Written Opinion Issued in International Application No. PCT/GB2019/052173, dated Nov. 11, 2019, 12 pages.

* cited by examiner

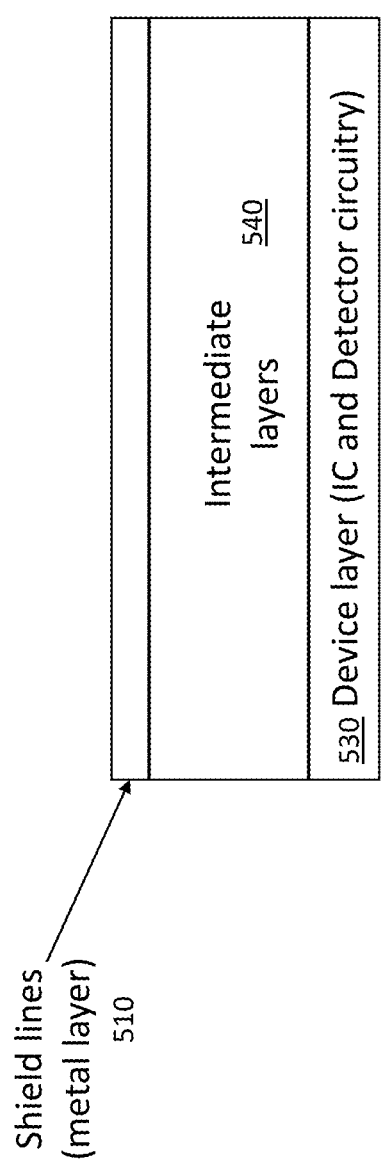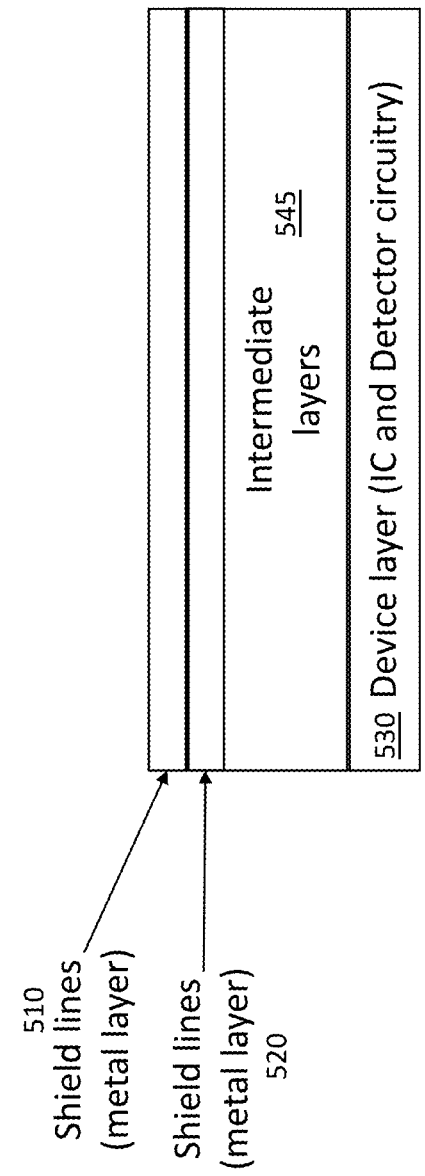

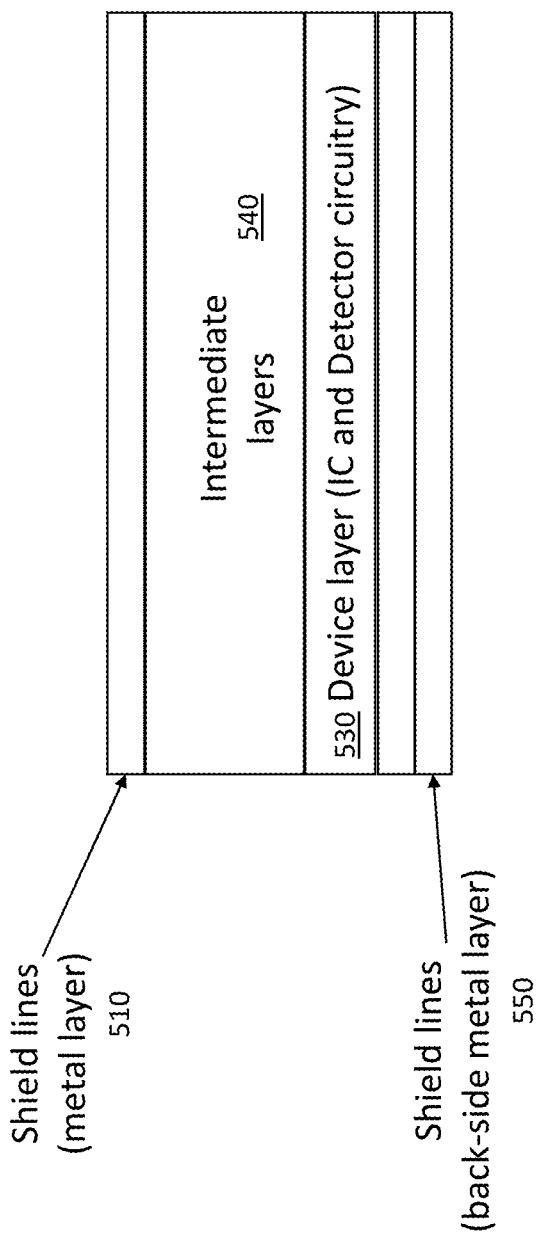

CIRCUIT ALTERATION DETECTION IN INTEGRATED CIRCUITS

BACKGROUND

Integrated circuits (ICs) may include designs that contain sensitive information. An example of such sensitive information is the secret key information used in crypto engine implementations (such as AES). In security critical integrated circuits, security countermeasures are often implemented to provide safety of the sensitive information against side channel attacks. Some side channel attack techniques include physical attacks that require actual physical access to the inner layers of the integrated circuit. Passive or active shields can be added to ICs as countermeasures to protect sensitive information on ICs from unauthorized or unintended access methods for the circuit.

For both passive shielding and active shielding, an IC is covered with metal lines that are disposed on top of the IC, for example in the top metal layer to hide the circuit beneath. For active shielding, these metal lines are connected to a voltage supply (power and ground) or supplied with a predefined or random test data from a transmitter, and observed with a number of receivers located at certain points of the integrated circuit. For a case where the active shield uses a voltage supply, the receivers are also coupled to power or ground to compare whether there is a change. For a case using test data, the receivers may also be supplied with the same test data internally in order to compare the data on the shielding metals and the actual test data. The receivers verify the integrity of the metal lines based on the output of the comparison. However, detection of a breach may be avoided with attack techniques where a portion of the shield is cut and reconstructed with a technique such as a focused ion beam to create a potential attack zone.

BRIEF SUMMARY

Circuit alteration detection in integrated circuits is described herein. The described circuit alteration detection and corresponding circuitry can identify a change in impedance characteristics on a protection shield to detect a circuit alteration.

An implementation of a system incorporating circuit alteration detection can include a shield in at least one metal layer over an integrated circuit; and a detector coupled to the shield to detect a change in impedance characteristics of one or more shield lines of the shield due to physical alteration of the shield.

The shield lines can be arranged in one or more metal layers and cover an area with shape arrangements such as parallel lines and serpentines. The detector can include one or more comparators to detect a difference in impedance of more than a tolerance value. An appropriate countermeasure response can be initiated upon detection of the difference in impedance.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIGS. 5A-5C illustrate cross-sectional views of the layers of an IC incorporating a shield for circuit alteration detection.

DETAILED DESCRIPTION

Circuit alteration detection in integrated circuits is described herein. The described circuit alteration detection and corresponding circuitry can protect secure or sensitive information that might be contained on an IC by identifying a change in impedance on one or more metal lines of a protection shield.

As mentioned above, shields can be added to ICs to protect sensitive information on ICs from unauthorized or unintended access methods. A countermeasure provided herein can be used alone or in conjunction with an active shielding technique to still detect alteration of a shield even when an attacker attempts to circumvent detection by reconstructing connections to the metal lines.

An implementation of a system incorporating a countermeasure with circuit alteration detection can include a shield in at least one metal layer over an integrated circuit; and a detector coupled to the shield to detect a change in impedance characteristics of one or more shield lines of the shield due to physical alteration of the shield. The detector can include one or more comparators to detect a difference in impedance of more than a tolerance value. An appropriate countermeasure response can be initiated upon detection of the difference in impedance.

Figure 1:
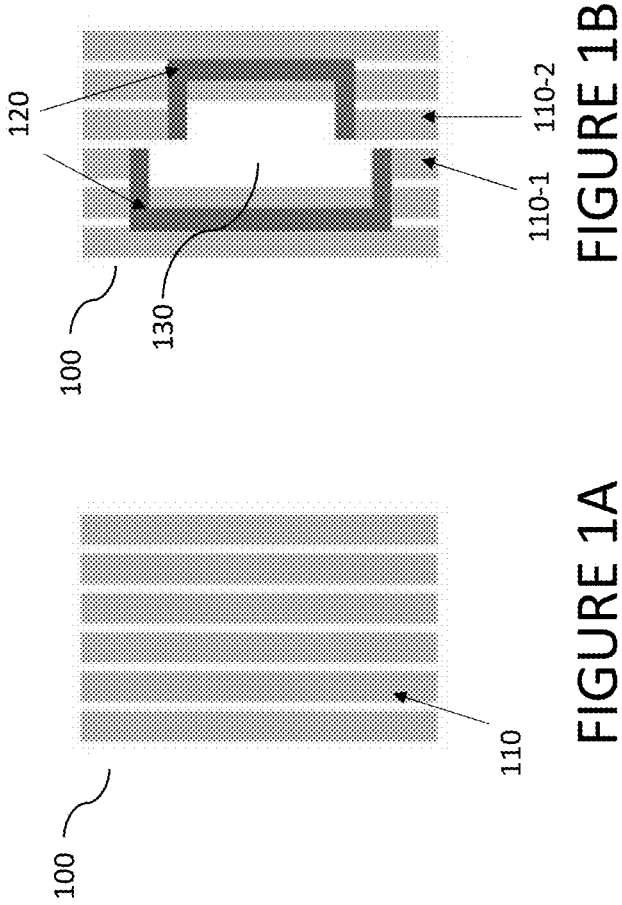
FIGS. 1A and 1B illustrate a physical alteration of a shield used as a countermeasure against a physical attack of an IC.

FIGS. 1A and 1B illustrate a physical alteration of a shield used as a countermeasure against a physical attack of an IC. FIG. 1A shows an example representation of a shield that may be used to protect a circuit from tampering. Referring to FIG. 1A, the shield 100 can include shield lines 110 in a metal layer over an integrated circuit. The shield 100 can be formed of any metal or conductive material as suitable for back-end-of line processing of the integrated circuit. For example, in some implementations, the shield lines 110 of the shield 100 can be formed of copper.

FIG. 1B shows an example of how a shield may be altered by tampering. Referring to FIG. 1B, two of the shield lines 110-1, 110-2 of the shield 100 may be cut by an attacker to reach circuitry below the shield. As mentioned above, active shielding may be circumvented by an attacker by applying a conductive material to maintain the signal path. For example, bypass lines 120 may be applied to reconstruct the cut metal line while creating a potential attack zone 130. The potential attack zone 130 is created to gain access to secure or sensitive information below metal lines. Often, material such as Tungsten is used to create bypass lines 120. Although such materials may avoid disruption to an active shield, these materials have different resistivity than the original material for the shield lines 110. As discussed in more detail with respect to FIGS. 6A-6C, the subject countermeasure with circuit alteration detection can detect when such a physical attack is occurring an initiate an appropriate countermeasure response.

Although a set of parallel metal lines are shown in the illustrative example of FIGS. 1A and 1B, a variety of arrangements of shield lines may be used for circuit alteration detection. For example, the shield lines can be arranged in one or more metal layers and cover an area with shape arrangements such as parallel lines and serpentines.

Figure 2:
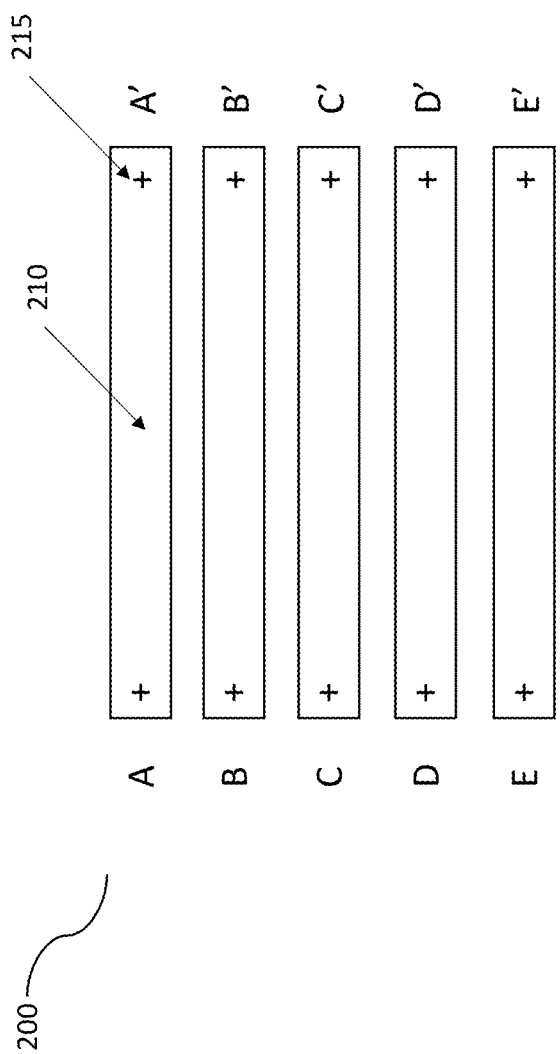
FIG. 2 shows an example arrangement of shield lines in a single metal layer.

FIG. 2 shows an example arrangement of shield lines in a single metal layer. Referring to FIG. 2, the shield arrangement 200 can include a multitude of shield lines 210 in the form of straight metal lines. Two or more tap nodes 215 can be provided in each shield line 210 from which to measure impedance between. In the illustrated example, resistance can be measured across A-A', B-B', C-C', D-D', and E-E'. Each shield line 210 can be designed to have about the same resistance by having a same length and width. When a portion of one or more of the shield lines 210 is removed, the resistance changes and can be detected by the measurement across the tap nodes 215 of that shield line 210.

Figure 3:
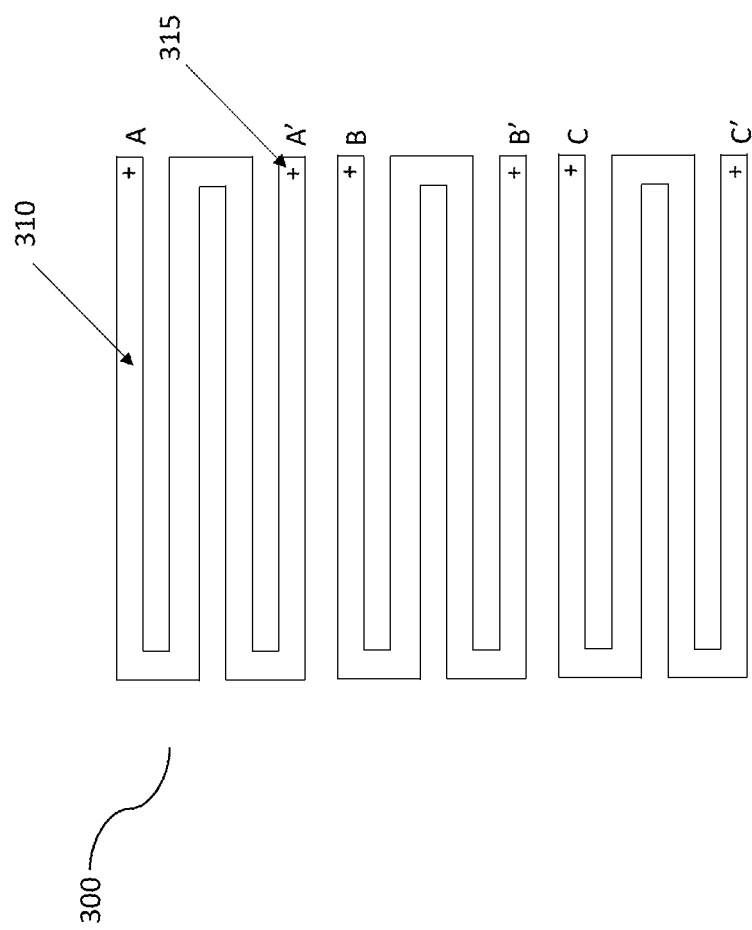
FIG. 3 shows another example arrangement of shield lines in a single metal layer.

FIG. 3 shows another example arrangement of shield lines in a single metal layer. Referring to FIG. 3, the shield arrangement 300 can include a multitude of shield lines 310 in the form of serpentine metal lines. Two or more tap nodes 315 can be provided in each shield line 310 to measure impedance, for example across A-A', B-B', and C-C'. In the illustrated example, the resistance value of a shield line 310 may be designed to have a higher resistance value by increasing the number of windings between two tap nodes 315.

Figure 4:
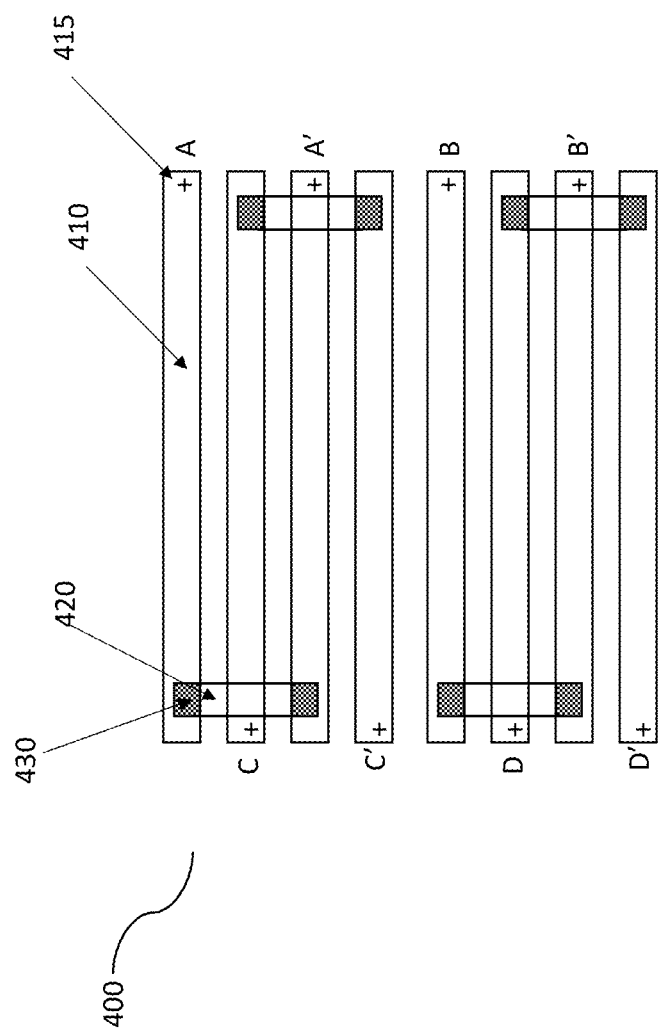
FIG. 4 shows an example arrangement of shield lines connected in different levels of metal layers.

FIG. 4 shows an example arrangement of shield lines connected in different levels of metal layers. Referring to the shield arrangement 400 of FIG. 4, a multitude of shield lines 410 in the form of straight metal lines can be provided in parallel in one metal layer similar to the shield lines 210 of FIG. 2. Two or more tap nodes 415 can be provided in each shield line 410 to measure impedance. To enable higher resistance values between two tap nodes 415, two or more of the shield lines 410 can be coupled together using connector lines 420 and contact vias 430 such that resistance can be measured across, for example, A-A', B-B', C-C', and D-D'. The connector lines 420 can be provided in a different metal layer than the shield lines 410. For example, the shield lines 410 can be formed at an N level metal layer and the connector lines 420 can be formed at an N−1 level metal layer.

FIGS. 5A-5C illustrate cross-sectional views of the layers of an IC incorporating a shield for circuit alteration detection. Referring to FIG. 5A, shield lines, such as described with respect to shield lines 210 and 310 of FIGS. 2 and 3, may be formed in a top metal layer 510 over a device layer 530 with intermediate layers 540 in between. Both the IC circuitry and the Detector circuitry can be fabricated in the device layer 530. The shield lines can be coupled to the detector circuitry through the intermediate layers 540.

Figure 7A:
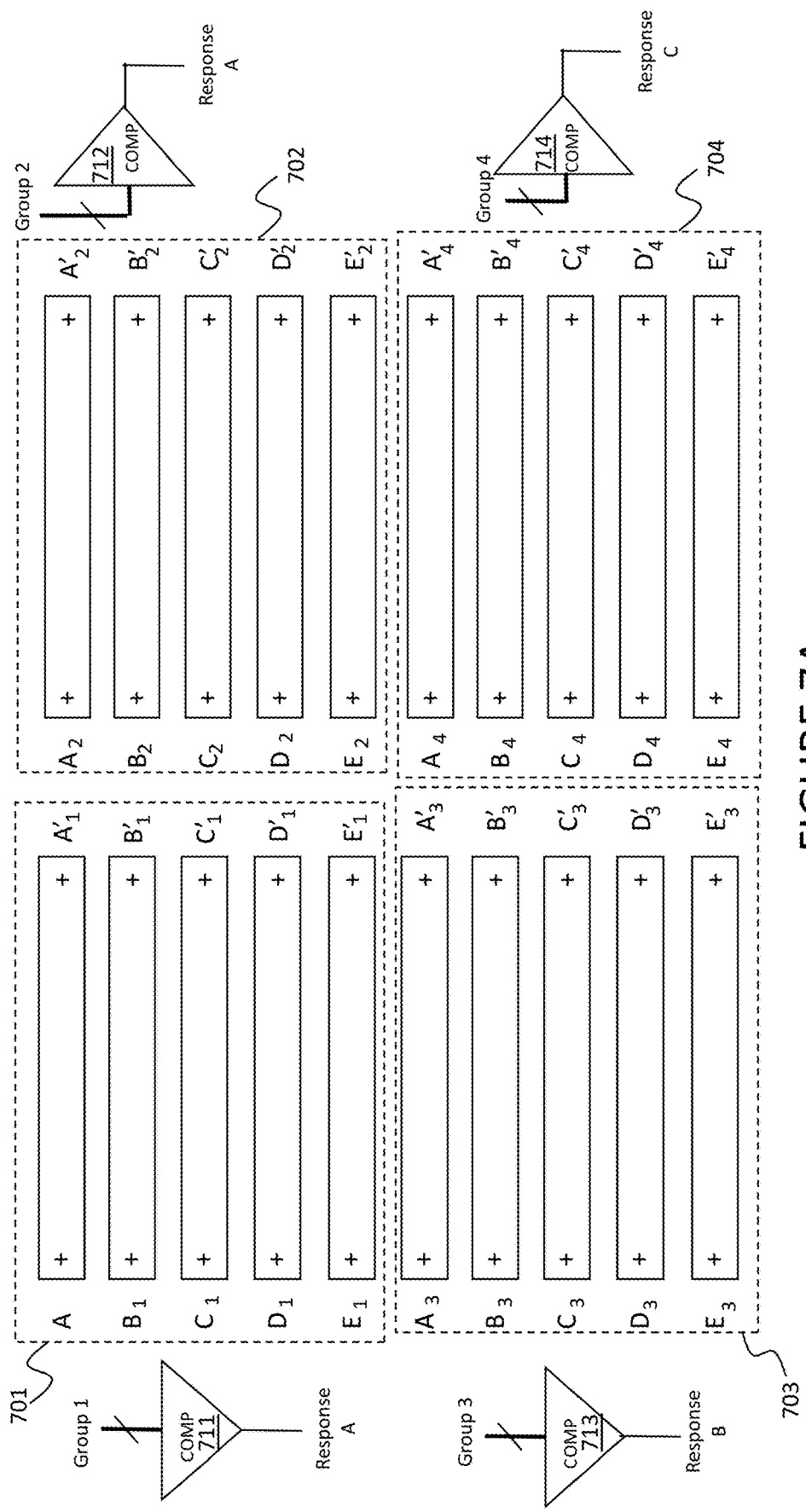
FIGS. 7A and 7B show example arrangements of shield with a plurality of groupings of shield lines.

In some cases, multiple groups of shield lines can be formed in the same metal layer (see e.g., FIG. 7A). In some cases, multiple shields may be provided in different levels of metal layers or a single shield may be formed using multiple levels metal layers. Referring to FIG. 5B, shield lines such as described with respect to shield lines 410 of FIG. 4 can be formed in a top metal layer 510 with connector lines such as described with respect to connector lines 420 of FIG. 4 formed in a lower metal layer 520. In some cases, shield lines such as described with respect to shield lines 210 and 310 of FIGS. 2 and 3 may be formed in both top metal layer 510 and lower metal layer 520. Shield line arrangements in the metal layers 510 and 520 can be provided over the device layer 530 with intermediate layers 545 in between. The shield lines can be coupled to the detector circuitry through the intermediate layers 545. The top metal layer 510 may be a top most metal level or a level below the top most metal level. The lower metal layer 520 may be the metal level immediately below the top metal layer 510 or other metal levels may be between the two metal layers.

In some cases, as illustrated in FIG. 5C, shield lines can be provided in a back-side metal layer 550 and coupled to detector circuitry in the device layer 530 to detect tampering to the back-side of an IC. Shield lines can also be provided in a top metal layer 510 and/or in a lower metal layer, such as lower metal layer 520 of FIG. 5B.

Various detection methods are possible. A method can include receiving a first impedance signal from a first shield line of a plurality of shield lines disposed over an integrated circuit in one or more metal lines; receiving a second impedance signal from a second shield line of the plurality of shield lines; comparing the first impedance signal to the second impedance signal; and generating a signal to initiate a countermeasure response when the first impedance signal is different from the second impedance signal by greater than a tolerance value. The impedance signal may be read using current or voltage (e.g., determining whether there has been an increase in current due to decrease of impedance or whether there has been a change in voltage using read using a voltage divider configuration).

Figure 6A:
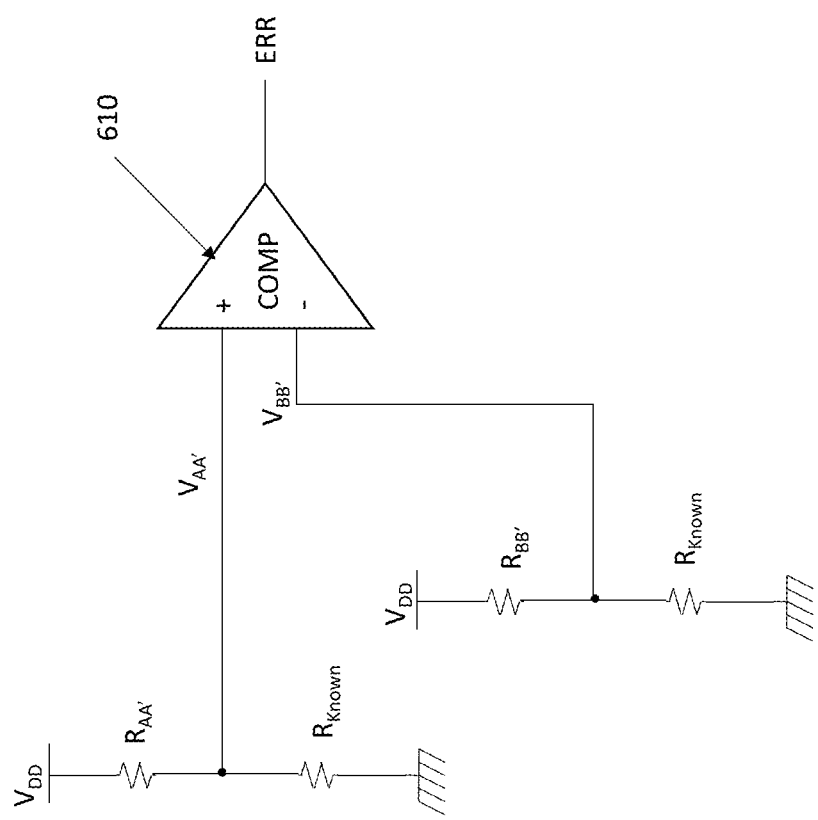
FIGS. 6A-6C show example representations of detection circuits.
Figure 6B:
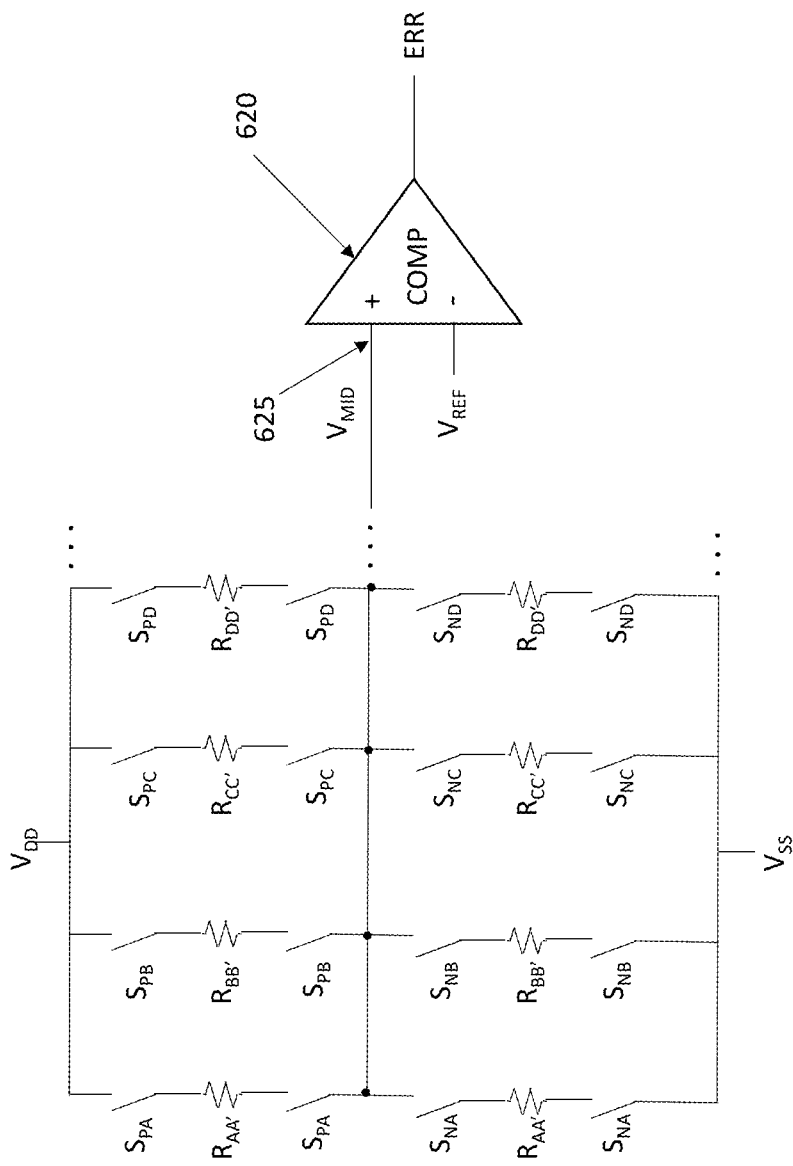
Figure 6C:
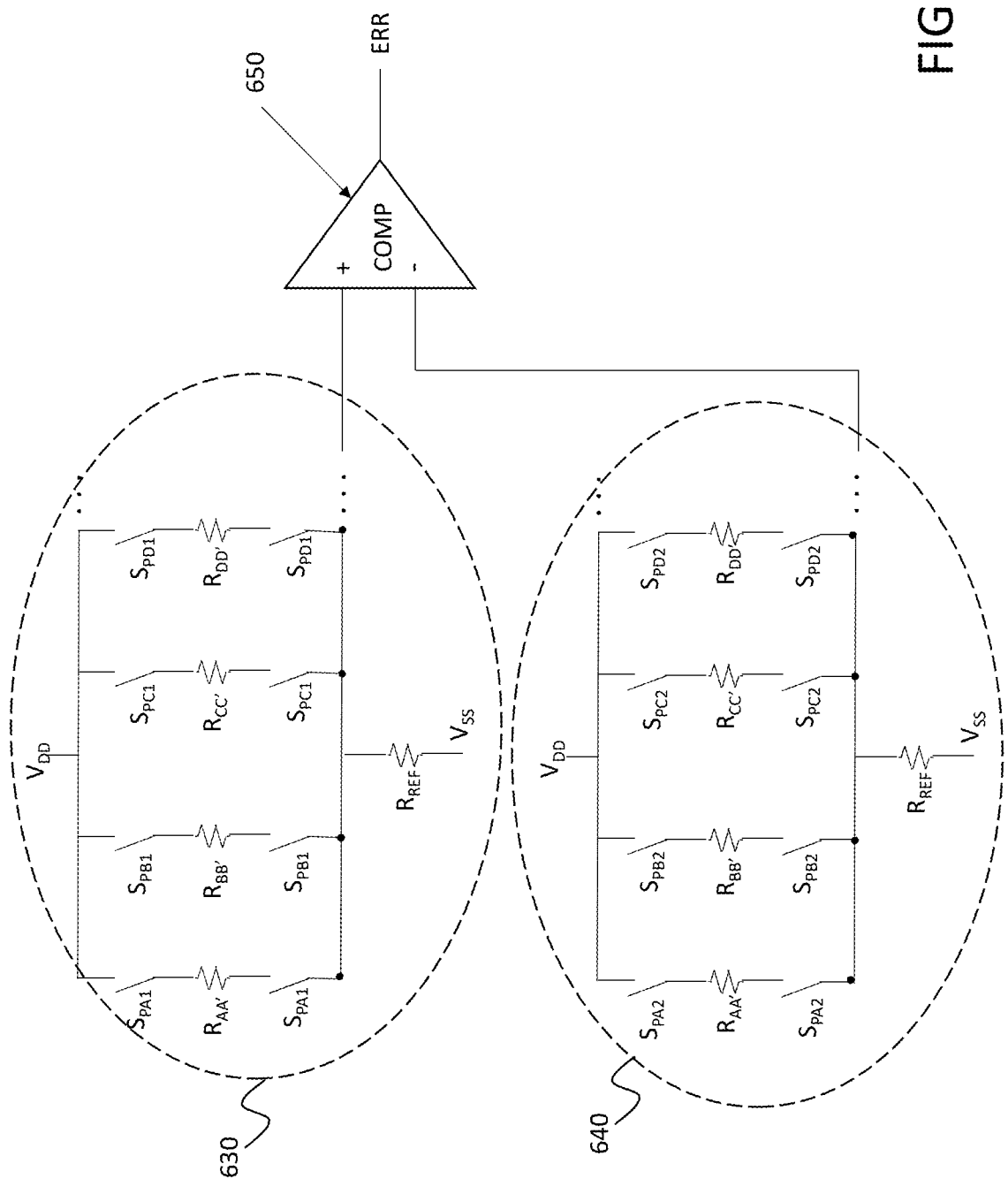

FIGS. 6A-6C show example representations of detection circuits. As mentioned above, a shield can be provided in at least one metal layer over an integrated circuit and a detector can be coupled to the shield to detect a change in impedance characteristics of one or more shield lines of the shield due to physical alteration of the shield. In some cases, the change in impedance characteristics may be detected by comparing the shield lines of a shield two-by-two, such as shown in FIG. 6A.

Referring to FIG. 6A, two shield lines (e.g., from A-A' and B-B' of any of the configurations shown in FIGS. 2-4) can be compared using a corresponding comparator 610. The resistance $R_{AA'}$ across A-A' can be compared to the resistance $R_{BB'}$ across B-B' using a voltage divider configuration such that the comparator 610 outputs an error signal (ERR) when the difference between $V_{AA'}$ and $V_{BB'}$ is greater than a tolerance value.

A comparison resistor of a set value $R_{Known}$ can be coupled to tap node A or A' of the first shield line with the other tap node A' or A coupled to a voltage line (e.g., VDD). The other end of the comparison resistor can be coupled to ground or another voltage line. The same comparison resistor or another comparison resistor of the same value $R_{Known}$ can be coupled to tap node B or B' or the second shield line with the other tap node B' or B coupled to a voltage line (e.g., VDD). When the same comparison resistor is used, a switch may be included to couple the resistor to one node and then the other (and back and forth). In some cases the comparison resistors are formed in a lower layer of the circuit (e.g., in a lower metal layer, a polysilicon layer, or device layer) and can be designed to have a same shape and material (but are not required to have same shape or material as the shield lines). The voltages $V_{AA'}$ and $V_{BB'}$ read by the comparator 610 can be stored in the comparator and compared. The two resistances are expected to have the same value (within a tolerance amount) because each shield pattern is identical. If there is a change of one or more of the resistances, for example, due to tampering, the comparator detects a difference in the voltage and outputs the error signal ERR, which can be used to initiate a countermeasure response.

In some cases, the change in impedance characteristics may be detected by comparing each shield line of a group of shield lines to each other such as possible by the configurations illustrated in FIGS. 6B and 6C.

FIG. 6B shows an example circuit configuration using a resistor bridge between the shield lines for circuit alteration detection. Referring to FIG. 6B, it can be seen that each shield line can have one tap node be selectively coupled to a voltage supply line (e.g., VDD) and a first voltage line (e.g., VSS) and the other tap node be selectively coupled to a comparator 620, which will output an error signal (ERR) when a voltage difference between its two inputs is greater than a tolerance value (e.g., absolute difference (VMID−VREF)>VTolerance). If the reference voltage is VDD/2, the comparator can show a difference between the resistance tied to VDD and the resistance tied to VSS. In the illustrated example, the resistance $R_{AA'}$ represents the measured resistance across a shield line A-A', the resistance $R_{BB'}$ represents the measured resistance across a shield line B-B', the resistance $R_{CC'}$ represents the measured resistance across a shield line C-C', and the resistance $R_{DD'}$ represents the measured resistance across a shield line D-D'. Any suitable numbers of shield lines of the same (within tolerance) resistance may be coupled to comparator 620 and may be in any suitable arrangement including, but not limited to, the arrangements illustrated in FIGS. 2-4.

Switches denoted as $S_{PA}$ connect (in some cases using a same control signal) the shield line A-A' to a voltage line $V_{DD}$ and the positive (+) input 625 of the comparator 620; and switches denoted as $S_{NA}$ connect (in some cases using a same control signal) the shield line A-A' to a first voltage line ($V_{SS}$) and the positive (+) input 625 of the comparator 620. Similarly, switches denoted as $S_{PB}$ connect (in some cases using a same control signal) the shield line B-B' to the voltage line $V_{DD}$ and the positive (+) input 625 of the comparator 620; and switches denoted as $S_{NB}$ connect (in some cases using a same control signal) the shield line B-B' to the first voltage line ($V_{SS}$) and the positive (+) input 625 of the comparator 620; switches denoted as $S_{PC}$ connect (in some cases using a same control signal) the shield line C-C' to the voltage line $V_{DD}$ and the positive (+) input 625 of the comparator 620; and switches denoted as $S_{NC}$ connect (in some cases using a same control signal) the shield line C-C' to the first voltage line ($V_{SS}$) and the positive (+) input 625 of the comparator 620; and switches denoted as $S_{PD}$ connect (in some cases using a same control signal) the shield line D-D' to the voltage line $V_{DD}$ and the positive (+) input 625 of the comparator 620; and switches denoted as $S_{ND}$ connect (in some cases using a same control signal) the shield line D-D' to the first voltage line ($V_{SS}$) and the positive (+) input 625 of the comparator 620.

In some cases, three switches (instead of four switches) may be used for each shield line: one to couple one end of the shield line to the voltage supply line, one to couple the one end of the shield line to the first voltage line, and one to couple the other end of the shield line to an intermediate node coupled to the positive input of the comparator. In some cases, two switches may be used for each shield line: one to couple one end of the shield line to the voltage supply line or to the first voltage line, and one to couple the other end of the shield line to the intermediate node coupled to the positive input of the comparator. In some cases, only a single switch is provided for each shield line. The single switch may be used to couple an end of the shield line to the voltage supply line or to the first voltage line (and in some cases only to one or the other, with the group of shield lines having some coupled to the voltage supply line and some coupled to the first voltage line). The other end of the shield line may be coupled to the positive input of the comparator.

In operation, a sequence of switching can be carried out to provide a voltage $V_{MID}$ and compare $V_{MID}$ to the reference voltage $V_{REF}$ applied to the negative (−) input of the comparator 620. For example, a sequence for comparisons can be, while the other switches are open, close $S_{NA}$ and $S_{PB}$ to output $V_{MID}$ emerging from the connection between resistance $R_{AA'}$ across A-A' and resistance $R_{BB'}$ across B-B'; close $S_{NA}$ and $S_{PC}$ to output $V_{MID}$ emerging from the connection between resistance $R_{AA'}$ across A-A' and resistance $R_{CC'}$ across C-C'; close $S_{NA}$ and $S_{PD}$ to output $V_{MID}$ emerging from the connection between resistance $R_{AA'}$ across A-A' and resistance $R_{DD'}$ across D-D'; close $S_{NB}$ and $S_{PC}$ to output $V_{MID}$ emerging from the connection between resistance $R_{BB'}$ across B-B' and resistance $R_{CC'}$ across C-C'; close $S_{NB}$ and $S_{PD}$ to output $V_{MID}$ emerging from the connection between resistance $R_{BB'}$ across B-B' and resistance $R_{DD'}$ across D-D'; and close $S_{NC}$ and $S_{PD}$ to output $V_{MID}$ emerging from the connection between resistance $R_{CC'}$ across C-C' and resistance $R_{DD'}$ across D-D'.

The measured voltages for $R_{AA'}$, $R_{BB'}$, $R_{CC'}$, and $R_{DD'}$ (and any others in coupled to the comparator 620) are expected to be identical (within tolerances) if the resistors are made with the same material and the implemented circuit is not altered. When $V_{MID}$ is not equal to $V_{DD}/2$, the comparator indicates that the resistances tied to $V_{DD}$ are different from the resistances tied to $V_{SS}$. So, it can be inferred that a shield line has been altered.

FIG. 6C shows another example circuit configuration using a resistor bridge between the shield lines for circuit alteration detection. Referring to FIG. 6C, a resistor bridge can be formed using the resistances $R_{AA'}$, $R_{BB'}$, $R_{CC'}$, and $R_{DD'}$ across the respective tap lines of the shield lines AA', BB', CC', and DD' and a reference resistor $R_{REF}$ selectively coupled to the shield lines. Instead of using other ones of the shield lines in the voltage divider for outputting $V_{MID}$ which is then compared to a reference voltage as shown in FIG. 6B, the resistance bridge of FIG. 6C, uses a reference resistor in the resistor bridge and compares voltages output from two of such resistor bridges 630 and 640 using comparator 650.

A reference voltage of bridge 630 is coupled to the positive (+) input of the comparator 650 and selectively coupled to the shield lines as those shield lines are selectively coupled to the positive (+) input of the comparator 650. Switches denoted as $S_{PA1}$ connect the shield line A-A' to a voltage line $V_{DD}$ and the positive (+) input of the comparator 650; switches denoted as $S_{PB1}$ connect the shield line B-B' to the voltage line $V_{DD}$ and the positive (+) input of the comparator 650; switches denoted as $S_{PC1}$ connect the shield line C-C' to the voltage line $V_{DD}$ and the positive (+) input of the comparator 650; and switches denoted as $S_{PD1}$ connect the shield line D-D' to the voltage line $V_{DD}$ and the positive (+) input of the comparator 650. A similar reference voltage is included in bridge 640 and coupled to the negative (−) input of the comparator 650 and selectively coupled to the shield lines as those shield lines are selectively coupled to the negative (−) input of the comparator 650. Switches denoted as $S_{PA2}$ connect the shield line A-A' to a first voltage line $V_{SS}$ and the negative (−) input of the comparator 650; switches denoted as $S_{PB2}$ connect the shield line B-B' to the first voltage line $V_{SS}$ and the negative (−) input of the comparator 650; switches denoted as $S_{PC2}$ connect the shield line C-C' to the first voltage line $V_{SS}$ and the negative (−) input of the comparator 650; and switches denoted as $S_{PD2}$ connect the shield line D-D' to the voltage first voltage line $V_{SS}$ and the negative (−) input of the comparator 650.

In some cases, three switches (instead of four switches) may be used for each shield line: one to couple one end of the shield line to a voltage supply line, one to couple another end of the shield line to the first input node of the comparator and an end of the first reference resistor; and one to couple the another end of the shield line to the second input node of the comparator and an end of the second reference resistor. In some cases, two switches may be used for each shield line. In one of such cases, one switch is provided to couple one end of the shield line to the voltage supply line, and a second switch is provided to couple the other end of the shield line to a first intermediate node coupled both the first reference resistor and to the positive input of the comparator while for another shield line that second switch is provided to couple the other end of that shield line to a second intermediate node coupled both the second reference resistor and to the negative input of the comparator. In another of such cases (of the two switch implementation for the configuration described with respect to FIG. 6C), one end of a shield line is coupled to the voltage supply line (without a switch), one switch is provided to couple another end of the shield line to the first intermediate node coupled to the first input node of the comparator and the end of the first reference resistor; and one switch is provided to couple the another end of the shield line to the second intermediate node coupled to the second input node of the comparator and the end of the second reference resistor.

The resistances may be compared to themselves (e.g., close both $S_{PA1}$ and $S_{PA2}$ during a comparison operation—where the switches in bridges 630 and 640 are not simultaneously closed) or each line to all the other lines, or some combination of comparisons. For example, if the switches $S_{PA1}$ are closed for the positive (+) input of the comparator and for the switches $S_{PB2}$ are closed for the negative (−) input of the comparator, then the voltage drop across $R_{AA'}$ can be compared to the voltage drop across $R_{BB''}$. Similarly, if the switches $S_{PA1}$ are closed for the positive (+) input of the comparator and for the switches $S_{PC2}$ are closed for the negative (−) input of the comparator, then the voltage drop across $R_{AA'}$ can be compared to the voltage drop across $R_{CC''}$.

The ERR output of any of the comparators (e.g., 610, 620, 650) can initiate a countermeasure response. The particular countermeasure response can be to reset, halt, or disable the system, obfuscate data operations, or perform another appropriate countermeasure response. For example, a countermeasure response that obfuscates or alters the data in some manner can be determined by the IC designer. One such approach can be to switch from performing a proper response to performing an improper response. An improper response refers to the responses intended to create power signatures which are indicative of a different key or a random key.

Figure 7B:
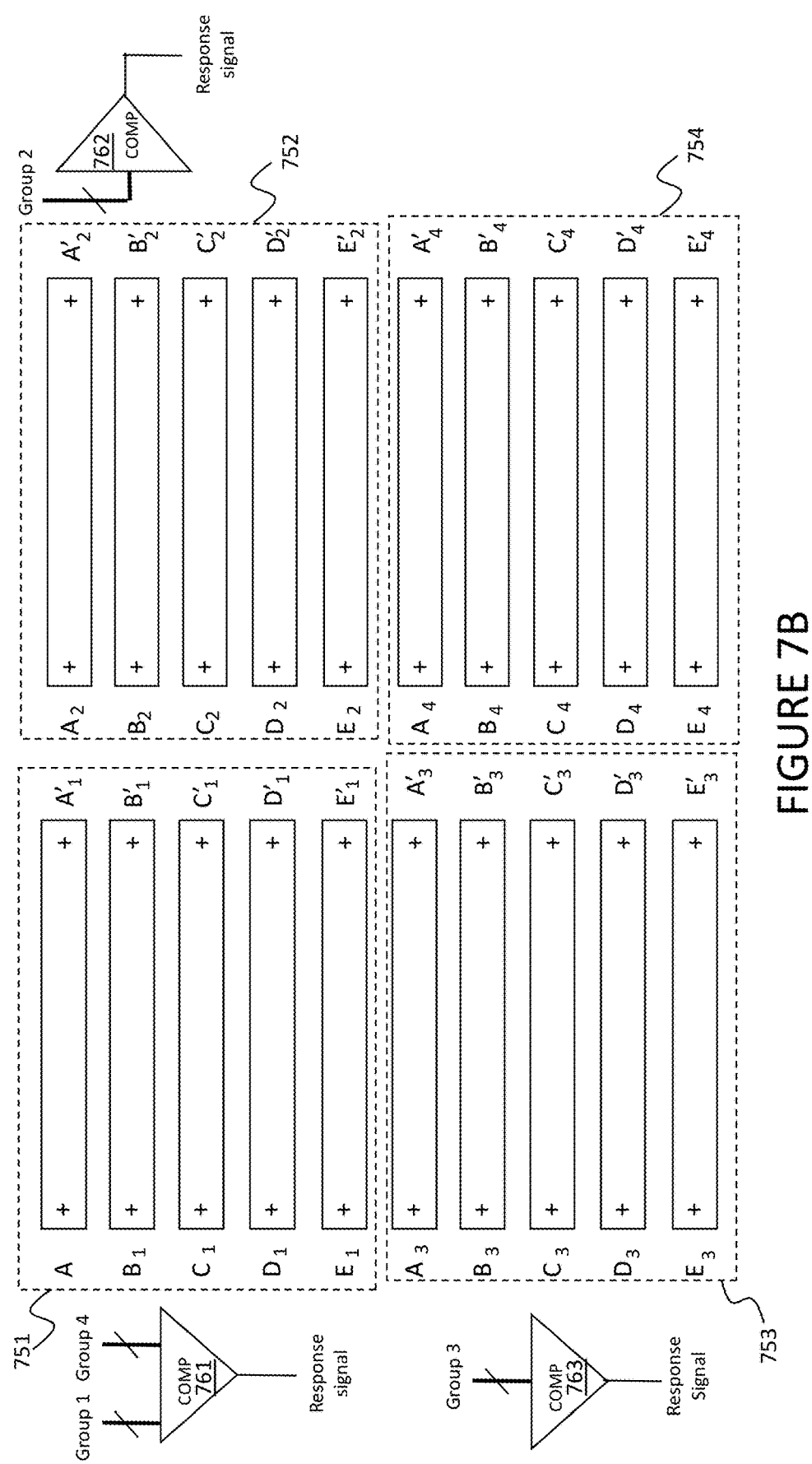

FIGS. 7A and 7B show example arrangements of shields with a plurality of groupings of shield lines. As illustrated in FIG. 7A, a plurality of groupings of shield lines may be provided, each grouping having its corresponding detection circuitry. The separate groups can be disposed over different regions of the chip, different metal layers of the chip, or both different metal layers and different regions of the chip, and may have corresponding different countermeasure responses applied in response to an error signal. For example, four groups 701, 702, 703, and 704 of shield lines can be coupled to corresponding detectors 711, 712, 713, and 714. Each group can have shield lines arranged in accordance with any suitable arrangement of shield lines, for example, as illustrated in FIGS. 2-4. Different groups may have different arrangements and/or resistances. When detector circuitry and connections such as described with respect to FIGS. 6A-6C are used for the corresponding detectors 711, 712, 713, and 714, the resistances within a group (e.g., 701, 702, 703, or 704) are made to be the same (even though the other groups may have different resistances).

The error signal output by each detector 711, 712, 713, and 714 can initiate a countermeasure response. The countermeasure responses may be different depending on the implementation. In addition, an error signal from one detector may initiate a different response than an error signal from another detector. In the illustrated example, an error signal from detector 711 or 712 can initiate a Response A. However, an error signal from detector 713 initiates a Response B and an error signal from detector 714 initiates a Response C, where Response A, Response B, and Response C, are different types of countermeasure responses (e.g., one may reset the circuit, one may shut down the circuit, one may cause improper responses to be output) or have different thresholds before implementing a countermeasure response (e.g., Response A may not initiate a particular response until three error signals are received while Response B initiates that particular response upon the first error signal being received).

As illustrated in FIG. 7B, a plurality of groupings of shield lines may be provided. The separate groups can be disposed over different regions of the chip, different metal layers of the chip, or both different metal layers and different regions of the chip, and may have the same or different countermeasure responses applied in response to an error signal. In the example shown in FIG. 7B, a single detection circuit may be coupled to multiple shields. For example, two groups of shield lines 751 and 754 may be coupled to a same detector 761. In some cases, other groups of shield lines 752, 753 may be coupled to the same or different detectors (e.g., detector 762 for group 752 and detector 763 for group 753). Each group can have shield lines arranged in accordance with any suitable arrangement of shield lines, for example, as illustrated in FIGS. 2-4. Different groups may have different arrangements and/or resistances. When detector circuitry and connections such as described with respect to FIGS. 6A-6C are used for the corresponding detectors 761, 762, and 763, the resistances within a group (e.g., 751, 752, 753, or 754) are made to be the same (even though the other groups may have different resistances).

Any reference in this specification to "one embodiment," "an embodiment," "example embodiment", "an example", "some examples", etc., means that a particular feature, structure, or characteristic described in connection with the embodiment or example is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A system, comprising:
 a shield in at least one metal layer over an integrated circuit and comprising a plurality of shield lines;
 a detector coupled to the shield to detect a change in impedance characteristics of one or more of the plurality of shield lines of the shield due to physical alteration of the shield, wherein the detector comprises a comparator, wherein the comparator comprises a first input node selectively coupled to the shield and a second input node coupled to receive a reference voltage; and
 three switches for each shield line, including a first switch that selectively couples one end of a shield line to a voltage supply line; a second switch that selectively couples the one end of the shield line to a first voltage line; and a third switch that selectively couples another end of the shield line to the first input node of the comparator;
 wherein the comparator reads a middle voltage VMID at the first input node when one of the plurality of shield lines is coupled to the voltage supply line and the first input node and another of the plurality of shield lines is coupled to the first voltage line and the first input node; and outputs an error signal when a voltage difference between VMID and the reference voltage is greater than a tolerance value.

2. The system of claim 1, wherein the plurality of shield lines is disposed in a single metal layer.

3. The system of claim 2, wherein the plurality of shield lines comprises an arrangement of parallel lines.

4. The system of claim 2, wherein the plurality of shield lines comprises an arrangement of serpentines.

5. The system of claim 1, wherein the plurality of shield lines is disposed in two or more metal layers.

6. The system of claim 5, wherein each shield line of the plurality of shield lines has at least one line in a first of the two or more metal layers and a line in a second of the two or more metal layers.

7. The system of claim 6, wherein the at least one line in a first of the two or more metal layers comprises two lines in the first of the two or more metal layers, wherein the line in the second of the two or more metal layers is a connector line that couples the two lines together into a multi-level serpentine shape.

8. The system of claim 1, further comprising a second shield in the at least one metal layer over the integrated circuit and comprising a second plurality of shield lines; and a second detector coupled to the second shield.

9. The system of claim 1, further comprising a second shield in a different at least one metal layer over the integrated circuit and comprising a second plurality of shield lines; and a second detector coupled to the second shield.

10. The system of claim 1, wherein the detector is coupled to tap points of each shield line.

11. A method comprising:
 receiving a first impedance signal from a first shield line of a plurality of shield lines disposed over an integrated circuit in one or more metal lines;
 receiving a second impedance signal from a second shield line of the plurality of shield lines;
 comparing the first impedance signal to the second impedance signal; and
 generating a signal to initiate a countermeasure response when the first impedance signal is different from the second impedance signal by greater than a tolerance value.

12. The method of claim 11, wherein receiving the first impedance signal and receiving the second impedance signal comprises receiving a middle voltage of a node coupling the first shield line to the second shield line; and
 wherein comparing the first impedance signal to the second impedance signal comprises comparing the middle voltage to a reference voltage.

13. The method of claim 11, wherein receiving the first impedance signal comprises receiving a first intermediate voltage of a node coupling the first shield line to a reference resistor;
 wherein receiving the second impedance signal comprises receiving a second intermediate voltage of a node coupling the second shield line to the reference resistor or a second reference resistor; and
 wherein comparing the first impedance signal to the second impedance signal comprises comparing the first intermediate voltage to the second intermediate voltage.

14. The method of claim 11, further comprising:
 receiving a third impedance signal from a third shield line of the plurality of shield lines;
 comparing the first impedance signal to the third impedance signal; and
 generating the signal to initiate the countermeasure response when the first impedance signal is different from the third impedance signal by greater than the tolerance value.

15. The method of claim 11, further comprising:
 receiving at least two impedance signals from a second set of shield lines disposed over the integrated circuit in one or more metal lines;
 comparing the at least two impedance signals; and
 generating a second signal to initiate a second countermeasure response different than the countermeasure response when the at least two impedance signals have a difference greater than the tolerance value.

16. A system, comprising:
 a shield in at least one metal layer over an integrated circuit and comprising a plurality of shield lines;
 a detector coupled to the shield to detect a change in impedance characteristics of one or more of the plurality of shield lines of the shield due to physical alteration of the shield, wherein the detector comprises a comparator, wherein the comparator comprises a first input node selectively coupled to the shield and a second input node coupled to the shield;
 a first reference resistor coupled at one end to a first voltage line;
 a second reference resistor coupled at one end to the first voltage line; and
 three switches for each shield line, including a first switch that selectively couples one end of a shield line to a voltage supply line; a second switch that selectively couples another end of the shield line to the first input node of the comparator and another end of the first reference resistor; and a third switch that selectively couples the another end of the shield line to the second input node of the comparator and another end of the second reference resistor.

17. The system of claim 16, wherein the plurality of shield lines is disposed in a single metal layer.

18. The system of claim 17, wherein the plurality of shield lines comprises an arrangement of parallel lines.

19. The system of claim 17, wherein the plurality of shield lines comprises an arrangement of serpentines.

20. The system of claim 16, wherein the plurality of shield lines is disposed in two or more metal layers.

21. The system of claim 20, wherein each shield line of the plurality of shield lines has at least one line in a first of the two or more metal layers and a line in a second of the two or more metal layers.

22. The system of claim 21, wherein the at least one line in a first of the two or more metal layers comprises two lines in the first of the two or more metal layers, wherein the line in the second of the two or more metal layers is a connector line that couples the two lines together into a multi-level serpentine shape.

23. The system of claim 16, further comprising a second shield in the at least one metal layer over the integrated circuit and comprising a second plurality of shield lines; and a second detector coupled to the second shield.

24. The system of claim 16, further comprising a second shield in a different at least one metal layer over the integrated circuit and comprising a second plurality of shield lines; and a second detector coupled to the second shield.

25. The system of claim 16, wherein the detector is coupled to tap points of each shield line.

\* \* \* \* \*